United States Patent [19]

Chiu

[11] Patent Number: 4,735,633
[45] Date of Patent: Apr. 5, 1988

[54] METHOD AND SYSTEM FOR VAPOR EXTRACTION FROM GASES

[76] Inventor: Kin-Chung R. Chiu, Scotts Valley, Calif.

[21] Appl. No.: 65,532

[22] Filed: Jun. 23, 1987

[51] Int. Cl.⁴ .............................................. B03C 9/02
[52] U.S. Cl. ................................... 55/2; 55/127; 55/130; 55/143; 55/145; 55/154; 118/723; 427/39
[58] Field of Search ............. 55/2, 127, 130, 141, 55/142, 143, 145, 154; 118/723; 427/38, 39

[56] References Cited

U.S. PATENT DOCUMENTS

| | | | |
|---|---|---|---|
| 387,286 | 8/1888 | Fewson | 55/2 X |
| 1,056,026 | 3/1913 | Hoofnagle | 55/2 X |
| 1,846,365 | 2/1932 | Seipp | 55/127 X |
| 3,805,492 | 4/1974 | King | 55/130 X |
| 3,853,512 | 12/1974 | Hayashi | 55/127 X |
| 3,948,625 | 4/1976 | Schultz | 55/138 X |
| 4,422,407 | 12/1983 | Bessot et al. | 427/38 X |
| 4,472,174 | 9/1984 | Chuan | 55/138 X |
| 4,483,883 | 11/1984 | Nath et al. | 427/39 |
| 4,491,606 | 1/1985 | Rosler et al. | 427/38 |
| 4,522,674 | 6/1985 | Ninomiya et al. | 118/723 X |
| 4,626,448 | 12/1986 | Hays | 427/39 |
| 4,664,938 | 5/1987 | Walker | 55/2 X |
| 4,675,089 | 6/1987 | Lory et al. | 427/39 X |

FOREIGN PATENT DOCUMENTS

| | | |
|---|---|---|
| 0158823 | 10/1985 | European Pat. Off. . |
| 0176295 | 4/1986 | European Pat. Off. . |
| 215706 | 11/1984 | Fed. Rep. of Germany . |
| 230790 | 12/1985 | Fed. Rep. of Germany . |
| 108514 | 8/1961 | Japan . |
| 129868 | 11/1976 | Japan . |
| 6231 | 1/1983 | Japan . |
| 45718 | 3/1983 | Japan . |
| 137421 | 7/1985 | Japan . |
| 193522 | 10/1985 | Japan . |
| 217221 | 3/1942 | Switzerland ............. 55/130 |
| 2158055 | 11/1985 | United Kingdom . |

Primary Examiner—Kathleen J. Prunner
Attorney, Agent, or Firm—Townsend & Townsend

[57] ABSTRACT

Vapor phase waste species are removed from effluent gas streams using a plasma extraction reactor comprising a pair of parallel, spaced-apart electrodes. The electrodes are driven under conditions, usually at radio frequency, to induce a glow discharge in the waste species, and the excited species are deposited directly on the electrode surface. By providing a very high ratio of electrode area to reactor volume and waste gas volumetric flow rate, substantially complete removal of the waste species can be effected. The system is particularly useful in removing contaminant species discharged from semiconductor processing operations, such as chemical vapor deposition and plasma etching. The method and system are particularly advantageous in that the vapor phase waste products are converted to a solid phase deposited directly on the electrodes which may then be disposed of.

26 Claims, 6 Drawing Sheets

METHOD AND SYSTEM FOR VAPOR EXTRACTION FROM GASES

BACKGROUND OF THE INVENTION

1. Field of the Invention

The present invention relates generally to the treatment of effluent gas streams to remove contaminant vapors therefrom. More particularly, the invention relates to the removal of such vapors by a plasma-enhanced extraction process.

Semiconductor fabrication processes use large amounts of a variety of toxic, corrosive, and flammable gases. For example, chemical vapor deposition (CVD) processes utilize large volumes of silane, dichlorosilane, ammonia, nitric oxides, arsine, phosphine, diborine, boron trichloride, and the like, only a small portion of which are actually consumed in the process. Thus, the waste streams discharged from these processes contain relatively high concentrations of very toxic species. It has become an environmental and legal imperative to remove such toxic species prior to release of the effluent gas streams to the atmosphere.

A variety of conventional gas treatment methodologies have been adapted to treat the gas effluents from semiconductor fabrication processes. One of the most common approaches is to decompose, react, or combust the contaminants at high temperatures. For example, silane may be burned with oxygen or air, producing silicon dioxide particles. Unfortunately, silane combustion suffers from a number of drawbacks. First, the silicon dioxide particles form a very fine powder (as a result of gas phase reaction) which can clog the burner and frequently leads to failure of the combustion system. Second, the particles are generally collected by water scrubbing, and the scrubbing water must itself be treated prior to disposal to remove the particles as well as various water soluble contaminants.

Scrubbing with water, chemical solutions, and dry chemicals have also been used to treat waste effluent gases from semiconductor fabrication processes. Water scrubbing may be used to dissolve water soluble components of the effluent gas. For contaminants which are insoluble or sparingly soluble in water, chemical scrubbing can be used. Although effective, the water or chemical absorbent must be treated prior to release from the plant. With increasingly stringent controls on water pollution, such scrubbing techniques are becoming less attractive. Dry chemical adsorption and/or reaction may also be relied on to extract the contaminant species from the gas. Unfortunately, such dry chemical scrubbing is inefficient for treating large volumes of gaseous effluents.

The most widely used treatment method is dilution. That is, the concentrations of toxic species are reduced by combining the waste effluent gas stream with large volumes of air or an inert diluent gas. While such reduction of concentration levels may literally satisfy existing effluent limits, they in fact result in no actual reduction in the amount of toxic species released to the atmosphere. Moreover, as pollution regulations are tightened in the future, the use of dilution as a treatment methodology will become less acceptable.

Plasma-enhanced systems have also been proposed for treatment of effluent gases. Such systems, however, have heretofore relied on gas phase reaction which usually results in the formation of a very fine powder which itself presents substantial collection and disposal problems.

For the above reasons, it would be desirable to provide methods and apparatuses which are capable of substantially completely removing vapor phase contaminants from gaseous waste effluent streams. It would be particularly desirable if such methods resulted in the conversion of the vapor phase contaminants to a solid phase which is amenable to containment. Ideally, the method will result in the deposition of a solid phase layer of an inert material on a disposable substrate (rather than a fine powder or dust), so that the contaminants are prevented from entering the air and/or water. Such methods should also be economic, requiring only moderate capital and operating expenses, and should be easily incorporated into existing semiconductor fabrication plants so that they are likely to be utilized, and should be capable of handling relatively large volumes of gaseous effluents.

2. Description of the Background Art

Plasma-enhanced destruction of contaminants from plasma-type reactors is known. Japanese patent application No. 58-6231 teaches the use of a parallel plate plasma reactor in series with a primary CVD reactor, where the plasma reactor is used to decompose silane exhausted from the CVD reactor. German patent application No. 230,790 similarly teaches the use of a plasma to react halogen vapor effluent from a plasma etcher. Neither the Japanese nor the German application teach the deposition of the contaminants onto a solid phase for disposal. Apparently, particulates are formed in the gas phase and continually removed as a powder from the system.

Plasma-enhanced treatment of effluent gases is taught in a number of the other patents and applications, but none teach a deposition/extraction mechanism. Japanese patent application No. 51-129868, German application No. 215,706, European application No. 176,295, and Japanese application No. 52-078176 all teach the plasmaphase reaction of an effluent with a reactant to produce inert species. Japanese patent application No. 49-122879 teaches the treatment of nitrogen-oxides in a plasma by reacting with iron, aluminum, or hydrogen to produce stable compounds. Other patents teach the use of glow discharge and/or other electronic excitation to assist in decomposing waste gases. See, e.g., Japanese patent application No. 51-094178, British patent No. 2158055 (which teaches the production of solid products), European patent No. 158,823, Japanese patent No. 60-193522, Japanese patent No. 60-137421, and Japanese patent application No. 56-108514.

Japanese patent application No. 58-45718 discloses the use of spiral gas mixing electrodes in a gas effluent treatment system. The system, however, does not operate by deposition of the contaminants, but rather by ionization and oxidation. U.S. Pat. No. 4,491,606 discloses a particular device for spacing parallel electrodes in a conventional plasma-enhanced CVD system.

SUMMARY OF THE INVENTION

The present invention provides a method and apparatus for the substantially complete removal of vapor phase contaminants from an exhaust gas stream, particularly from waste gas streams from semiconductor processing equipment, such as chemical vapor deposition and plasma etch reactors. Such complete removal is achieved by locating a plasma extraction reactor downstream from the processing equipment. The plasma extraction reactor includes at least one pair of opposed, parallel electrodes which are driven under conditions selected to electronically excite the vapor molecules, creating excited species which are deposited directly onto the surface of the electrodes to form a stable film thereon. The vapor is thus converted directly to a solid which may be conveniently disposed of.

The plasma extraction reactor of the present invention differs from both the plasma effluent treatment methods discussed above and conventional plasma deposition reactors in a number of characteristics. In particular, the plasma extraction reactor will have a relatively high ratio of electrode area to reactor volume, usually being at least about 1 cm$^{-1}$, more usually being at least about 2 cm$^{-1}$, and preferably being at least about 3 cm$^{-1}$, where reactor volume is defined as the volume between the electrodes and electrode area is defined to include the surface areas of both electrodes adjacent the volume. The large electrode area relative to reactor volume favors the reaction of the excited vapor molecules at the electrode surface rather than in the gas phase, resulting in the desired film formation rather than a powder.

Other characteristics of the plasma extraction reactor include, a relatively long flow path between the adjacent electrodes to assure substantially complete removal of the contaminant vapors. Usually, the flow path length will be at least about 100 cm, more usually being at least about 250 cm, and frequently being 500 cm or more. Also, a minimum ratio of electrode area to effluent flow rate will usually be provided to assure that the vapor removal capacity is not over-loaded. The ratio will usually be at least about 10 min/cm, more usually being at least about 50 min/cm, and frequently being at least about 100 min/cm, or greater, where the flow rate is measured at standard conditions (i.e., standard cm$^3$ per minute). Together, the lengthy flow path and the high ratio of electrode area assure substantially complete extraction of the waste vapors from the effluent gas stream. In contrast, conventional plasma deposition reactors rely on the presence of a substantial excess of the vapor to be deposited in order to achieve uniform deposition. Thus, the flow path length will usually be below 100 cm and the ratio of electrode area to flow rate will usually be maintained below 1 min/cm.

In the preferred embodiment, the electrodes are easily replaceable electrodes which may be disposed of after a predetermined thickness of the solid film has been deposited thereon. The electrodes will usually be configured as concentric spirals or rings and waste gas flow is directed from the outer periphery of the electrode to an inner collection core. Both spiral and ring electrodes focus the rf field near the center or core so that the removal efficiency of the reactor is enhanced near the end of the gas flow path, improving the overall removal of the vapor phase contaminants from the effluent stream. In addition, the spiral geometry provides a long and uninterrupted flow path in a particularly compact reactor.

Employing the method and apparatus of the present invention, vapor extraction efficiencies in excess of about 75 mole %, usually in excess of about 90 mole %, and frequently above about 95 mole % can be achieved.

DESCRIPTION OF THE SPECIFIC EMBODIMENTS

Semiconductor processing operations, such as chemical vapor deposition (CVD), low pressure CVD, plasma-enhanced CVD, plasma etching, epitaxial deposition, and the like, produce a variety of toxic vapors which must not be released into the atmosphere. Depending on the particular processing operation, the toxic vapors may include silane ($SiH_4$), arsine ($AsH_3$), boron hydride ($B_2H_6$), phosphine ($PH_3$), tungsten hexafluoride ($WF_6$), boron tribromide ($BBr_3$), boron trichloride ($BCl_3$), phosphorous tribromide ($PBr_3$), tetraethyl organosilicate (($C_2H_5O)_4Si$)), triisobutyl aluminum (($C_4H_9)_3Al$)) other organometallics, and the like. The present invention is also able to remove halogenated hydrocarbons, particularly chlorinated and fluorinated hydrocarbons, from processing waste effluents, usually plasma etch reactors where the halogenated hydrocarbons are the etchant. The present invention will also find use in converting nitric oxides from semiconductor processes and other sources to nitrogen and oxygen.

The present invention employs a plasma extraction reactor having a pair of parallel, spaced-apart electrodes which are driven at radio frequency in order to electronically excite the waste vapor molecules which are passed between the electrodes. Generally, the electrodes are exposed directly to the effluent, and the rf electric field decomposes the waste vapor molecules to produce species which react at the surface of the electrode to produce a solid film layer of material. The chemistry of the individual reactions will vary depending on the composition of the particular waste gas being treated. Exemplary reaction formulas are set forth in Table 1 below.

TABLE 1

| Toxic Vapor | Reaction |
| --- | --- |
| Silane | $SiH_4(g) + rf = Si_{(s)} + 2H_2(g)$ |
| Arsine | $2AsH_3(g) + rf = 2As_{(s)} + 3H_2(g)$ |
| Phosphine | $2PH_3(g) + rf = 2P_{(s)} + 3H_2(g)$ |
| Diborine | $B_2H_6(g) + rf = 2B_{(s)} + 3H_2(g)$ |
| Tungsten hexafluoride | $WF_6 + rf = W_{(s)} + 3F_2(g)$ |
| Dichlorsilane | $SiCl_2H_2 + rf = Si_{(s)} + 2HCl_{(g)}$ |
| Mixed Vapor Reactions: | |
| $SiH_4 + 4NO + rf = SiO_{2(s)} + 2N_2(g) + 2H_2O(g)$ | |
| $SiH_4 + 4N_2O + rf = SiO_{2(s)} + 4N_2(g) + 2H_2O(g)$ | |
| $2SiH_4 + 2NH_3 + rf = 2SiN_{(s)} + 7H_2(g)$ | |
| $2SiH_4 + WF_6 + rf = WSi_{2(s)} + 6HF_{(g)} + H_2(g)$ | |

The plasma extraction reactor will include an enclosed reaction vessel housing at least one pair of parallel, spaced-apart electrodes defining a flow path therebetween. The flow path may be linear, but usually will be convoluted in order to reduce the size of the reactor and enhance the structural strength of the structure. Depending on the geometry of the electrodes, two or more pairs of electrodes may find use. The vessel will include at least one inlet and one outlet, and the spaced-apart electrodes will define a flow path from the inlet to the outlet. Preferably, the electrode pairs will be arranged as concentric spirals or rings, and the flow path will be from the outer periphery of the reactor to an inner collection core at the center. By arranging the electrodes in generally concentric spirals or rings, the electric field is focused at the center of the reactor which forms the downstream portion of the waste gas flow path. Such focused energy enhances the excitation of the vapor molecules, facilitating their removal as their concentration in the waste gas stream is depleted toward the end of the flow path.

Although the preferred electrode arrangement is in a spiral or concentric ring geometry, flat parallel plates and other geometries may also find use. For example, flat plates, circular discs, and cones may be interleaved or nested in parallel to define a reversing serpentine path having the desired ratios of electrode area to reactor volume and flowpath length to distance between electrodes, as set forth in detail below.

To effect complete removal of the waste vapor molecules, and enhance nucleation of the species on the electrode surface to form a film, it is necessary to increase the ratio of electrode area to reactor volume when compared to conventional plasma-enhanced CVD reactors. In conventional reactors, it is necessary to provide a relatively large reactor volume relative to the electrode area in order to assure relatively free mass transport and that the species being deposited is not depleted and remains at an essentially constant concentration throughout the reactor. Thus, only a small percentage of the reactants entering the reactor, typically about 5 to 10%, are actually consumed in the reactor. In contrast, the present invention requires the substantially complete removal of the reactant species prior to any release to the atmosphere. To achieve this, relatively large electrode areas are provided, both relative to the reactor volume defined between the electrodes and relative to the expected volumetric flow rate of species being extracted. Usually, the ratio of electrode area to reactor volume is at least 1 cm$^{-1}$, more usually being at least 2 cm$^{-1}$, and preferably being at least 3 cm$^{-1}$. Conventional plasma-enhanced CVD reactors normally have a ratio of electrode area (i.e., exposed wafer area) to reactor volume of well below 1 cm$^{-1}$, usually below 0.5 cm$^{-1}$.

In addition, to further assure complete removal of the toxic vapors, the flow rate of the effluent gas is limited relative to the electrode area, and a minimum flow path length is provided. The ratio of the electrode area to the expected volumetric flow rate of waste gas species (under standard conditions), is usually above about 10 min/cm, more usually above about 50 min/cm, and may be 100 min/cm or higher. This is in contrast to the flow rate through conventional plasma-enhanced deposition reactors where the ratio of electrode area to flow rate usually does not exceed about 10 min/cm, and more usually does not exceed above about 5 min/cm. The length of the flow path between the adjacent electrodes will usually be at least about 100 cm, more usually being at least about 250 cm, and frequently being 500 cm or greater.

The electrodes of the present invention may be formed from virtually any conductive metal or alloy. Conveniently, relatively inexpensive metals, such as aluminum, iron and their alloys, will find the greatest use. The electrodes may be formed into their desired final geometry by conventional means, such as stamping, punching, or rolling. As described above, the electrodes will generally be disposable, and should be designed for easy mounting and demounting within the reactor.

The plasma extraction reactor will be located downstream from the waste gas source, usually being connected directly or indirectly to the vapor effluent outlet of the processing reactor. In the case of low pressure reactors, such as low pressure CVD reactors, the plasma extraction reactor may be connected downstream of the initial vacuum pump, such as a Roots blower, and immediately ahead of the backing second stage vacuum pump, typically a mechanical pump. Thus, the plasma extraction reactor will be operating at the staging pressure between these two pumps, typically in the range from about 0.1 to 10 Torr. In order to more minimize vapor phase nucleation of the reaction products, it is desirable that the reactor operating pressure be maintained below about 2 Torr and preferably below about 1 Torr.

The operating temperature of the plasma extraction reactor will be determined primarily by the amount of energy which is dissipated by the electrodes, typically being in the range from about room temperature to 500° C. Optionally, the electrodes may be supplementally heated by external means.

The power supply will operate at a drive frequency in the range from direct current to about 100 GHz, more usually in the range from about 25 kHz to 13.6 MHz. Suitable commercial units operate in the frequency band between about 25 to 460 kHz and at about 13.6 MHz. The power output of the supply will depend on the volume of gas to be treated in the area of the electrodes. Typically, the power supply should have an output equal to at least 0.01 watts per cm$^2$ of electrode area, more typically being about 0.05 watts per cm$^2$ of electrode area. The power to volumetric flow ratio should be in the range from about 0.5 to 5 watts per sccm (standard cm$^3$ per minute), typically being about 2 watts per sccm.

Figure 1:
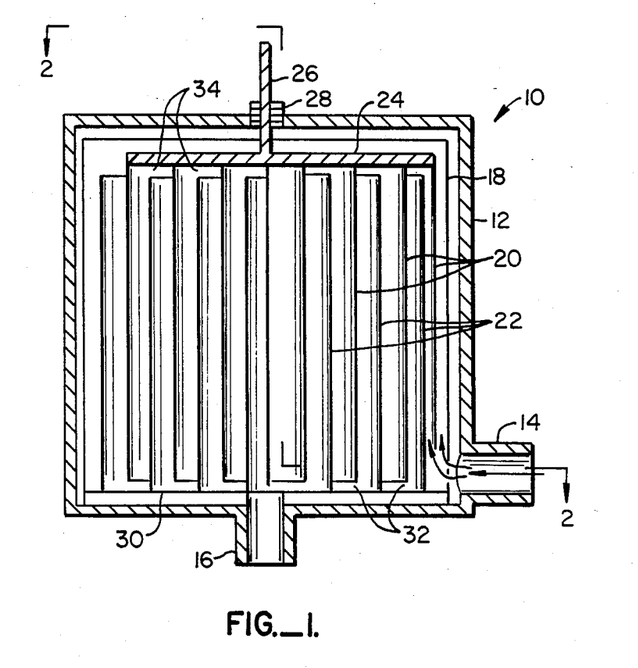
FIGS. 1 and 2 illustrate a preferred embodiment of the apparatus of the present invention employing nested, spiral electrodes.
Figure 2:
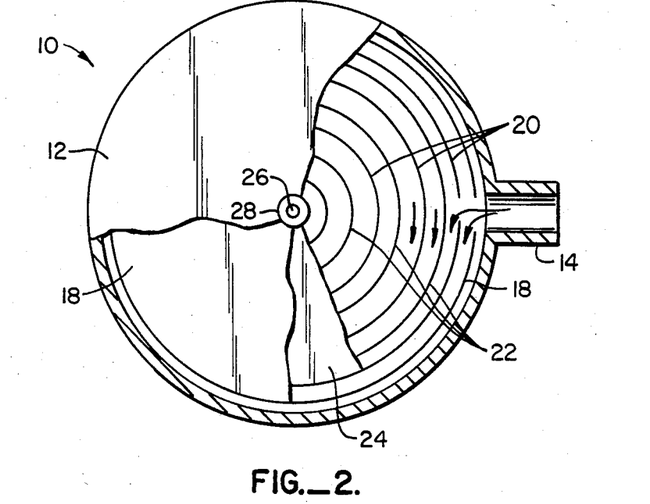

Referring to FIGS. 1 and 2, a preferred embodiment 10 of the apparatus of the present invention is illustrated. The preferred apparatus 10 includes a reaction chamber 12 having an inlet port 14 and outlet port 16. The reaction chamber 12 may be opened to permit the placement and removal of an electrode module 18. The electrode module 18 includes at least one pair of nested, spiral electrodes 20 and 22. Under certain circumstances, it may be desirable to provide two or more pairs of nested, spiral electrodes, but only one is illustrated in FIGS. 1 and 2 for convenience.

The first spiral electrode is attached at its upper end to a supporting bus 24 which acts both to distribute power evenly along the entire length of the electrode 20 and to serve as an upper boundary to the flow path defined by the nested electrodes 20 and 22. The supporting bus 24 is attached to an electric feedthrough conductor 26 which passes through ceramic seal 28 in the top wall of chamber 12. The ceramic seal 28 provides both a vacuum seal and electrical insulation.

The second electrode 22 is connected to the bottom plate 30 of the electrode module 18. The electrodes 20 and 22 are driven by connecting the connector bar 26 to a suitable DC or AC power source (as discussed above) and connecting the bottom plate 30 to ground.

Once the power is connected and turned on to the apparatus 10, a suitable electric field is generated between the nested electrodes 20 and 22. Gas flow may then be established by feeding through the inlet port 14. The gas flow will generally distribute around the spiral flow paths, dispersing evenly across the height of the flow paths. In addition to the spiral flow established by the spiral electrodes 20, there will be a cross-flow established through the gaps 32 between the first electrode 20 and the bottom plate 30, as well as through the gaps 34 between the second electrode 22 and the supporting bus 24. Such cross-flow helps establish uniform distribution of the effluent gas throughout the reaction chamber 12.

Figure 3:
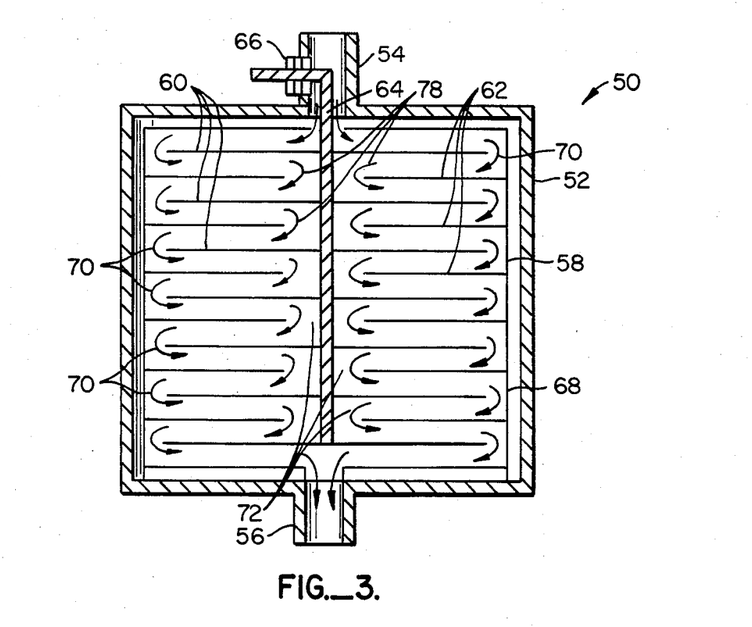
FIGS. 3 and 4 illustrate an alternative embodiment of the apparatus of the present invention.
Figure 4:
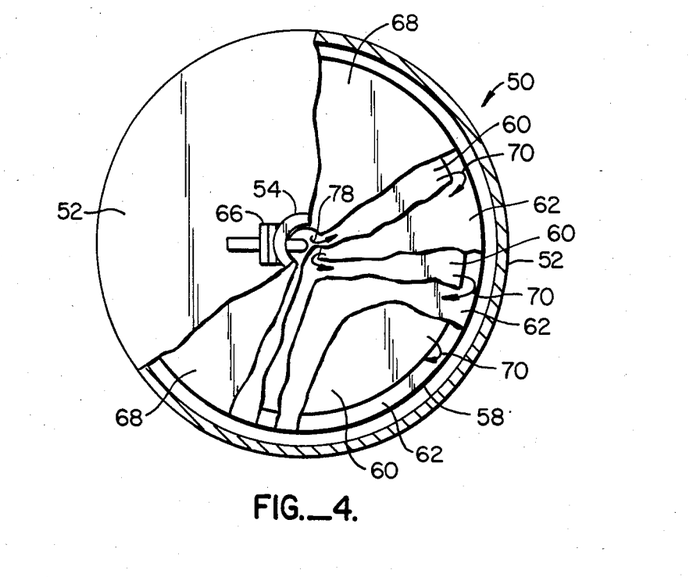

Referring now to FIGS. 3 and 4, an alternate embodiment 50 of the apparatus of the present invention is illustrated. The apparatus 50 includes a reaction chamber 52 having an inlet port 54 and outlet port 56. The reaction chamber 52 may be open, and a removable electrode module 58 is received in the interior of the chamber.

The electrode module 58 includes a plurality of first electrodes 60 which are stacked alternately with a plurality of second electrodes 62. The first electrodes 60 are attached at their center to a vertical support bus 64. The support bus 64 passes out through the inlet port 54 and is held in an insulating ring 66 in the chamber 52. The bus 64 may be attached to a desired power supply, as described above.

The second electrodes 62 are secured at their outer peripheries to the outer cylindrical wall 68 of the electrode module 58. By terminating the outer periphery of the first electrode 60 a preselected distance from the cylindrical wall 68, and terminating the second electrode 62 a predetermined distance from the vertical support bus 64, gaps 70 and 72 are left, respectively. These gaps provide a flow path for the effluent gases entering through inlet port 54 and exiting through outlet port 56. The flow path generally spreads radially outward above the highest of the first electrode 60, and then radially inward as it passes beneath the first electrode 60 and above the second electrode 62.

The alternate embodiment of the present invention illustrated in FIGS. 3 and 4 has the advantage that it is economical to construct, not requiring the fabrication of spiral electrodes. The operation of the alternate embodiment, however, will not be as efficient as that of the first embodiment illustrated in FIGS. 1 and 2, since there is no focusing of the electric field near the outlet port of the flow path.

It will be appreciated that a variety of other geometries for the apparatus of the present invention are also possible, so long as the minimum ratio of electrode area to reactor volume is maintained. It is also highly desirable that the ratio of the electrode area to the volumetric flow rate be kept above the value set forth above, and that the flow path length between the electrodes be kept above the minimum threshold levels set forth above.

The following examples are offered by way of illustration, not by way of limitation.

EXPERIMENTAL

Materials and Methods

1. Plasma Extraction Reactor (PER)

Figure 5:
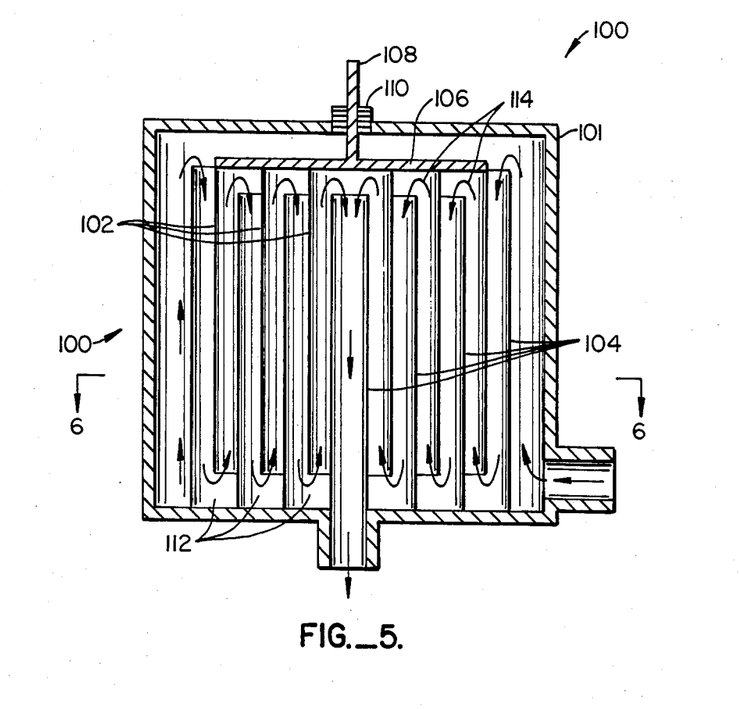
FIGS. 5 and 6 illustrate a prototype reactor utilized in the Experimental section herein.
Figure 6:
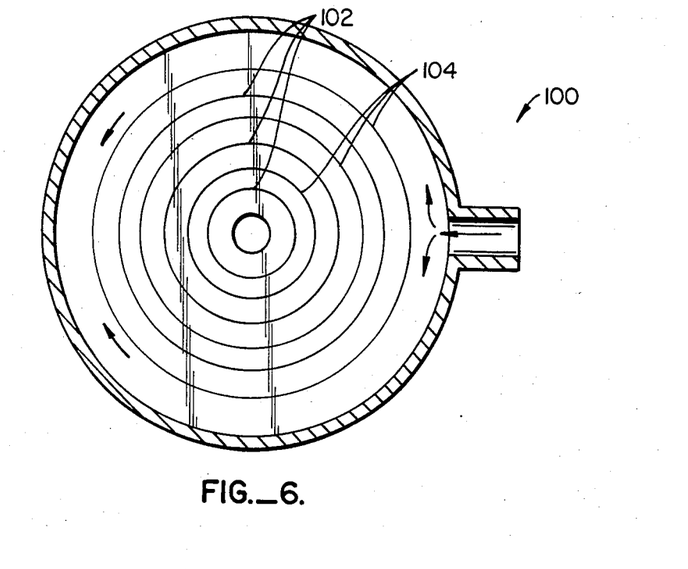

A prototype plasma extraction reactor (PER) was constructed as illustrated in FIGS. 5 and 6. The reactor 100 was similar to the reactor described in connection with FIGS. 1 and 2, except that the first and second electrodes were arranged as a plurality of concentric rings, rather than nested spirals.

The reactor 100 included a total of eight upper electrodes 102 (only three of which are illustrated in FIGS. 5 and 6) and nine lower electrodes 104 (only four of which are illustrated in FIGS. 5 and 6). The upper electrodes 102 are attached to an upper support bus 106, which in turn is connected to a connector bar 108. Connector bar 108 penetrates the upper end of enclosure 101, and is held in an insulating ring 110. The lower electrodes 104 are secured to the bottom plate of enclosure 101. Gaps 112 are formed between the lower ends of electrodes 102 and the bottom plate of enclosure 101. Gaps 114 are formed between the upper end of electrodes 104 and the bottom surface of support bus 106. In this way, the gas flow path as indicated by the arrows is defined.

The reactor enclosure 101 is a stainless steel cylindrical vessel having a diameter of 15.75 inches and a height of 13 inches. The top cover is an aluminum flange having two concentric O-ring seals with the interior space between the O-rings filled with nitrogen. The inlet connection is connected to a Roots blower, while the outlet connection is connected to a mechanical pump.

The support bus 106 is an aluminum disc which is 14.6 inches in diameter and 0.25 inches thick. The eight concentric electrodes 102 are also formed from aluminum, and have the following radii: 2.25 inches, 2.95 inches, 3.65 inches, 4.35 inches, 5.05 inches, 5.75 inches, 6.45 inches, and 7.15 inches. The heights of each electrode (reading from the smallest diameter outward) are as follows: 10.5 inches, 11.5 inches, 11.5 inches, 11.5 inches, 11.5 inches, 11.5 inches, 11.5 inches, and 10.5 inches.

The bottom electrodes are also formed from aluminum, and have the following radii: 1.5 inches, 2.6 inches, 3.3 inches, 4.0 inches, 4.7 inches, 5.4 inches, 6.1 inches, 6.8 inches, and 7.5 inches. The heights of the electrodes (reading from the innermost electrode outward) are as follows: 10.5 inches, 12 inches, 12 inches, 12 inches, 12 inches, 12 inches, 12 inches, 12 inches, and 11.75 inches. The gaps left between the electrodes 102 and the bottom plate of the enclosure are approximately 1.25 inches, while the gaps between the electrodes 104 and the support bus 106 are approximately 0.625 inches. Orifices (0.2 inches × 0.5 inches) were formed near the top edge of the outermost electrode 104 in order to evenly distribute the incoming gas flow through the reactor.

The apparatus just described was driven with an ENI Plasmaloc 3 power supply operated at 75 kHz at a power up to 3000 watts with a matching impedance of 300 ohms.

2. Test System Configuration

The PER was downstream from the reactor chamber of a GENUS Model 8402 LPCVD reactor (between the Roots blower and the mechanical roughing pump) using short vacuum connections of sufficient size to provide a minimum pressure drop. A residual gas analyzer (RGA) was placed immediately downstream of the PER. This RGA was used to measure the silane and $H_2$ signals as a function of the rf power in the PER. A thermocouple (TC) pressure gauge was placed immediately upstream of the PER.

Silane gas was passed through the PER at a known flow rate with the power off to provide a zero signal. Power-on/power-off measurements at several gas flow rates and power levels were repeated, and the results were found to be reproducible.

Figure 7:
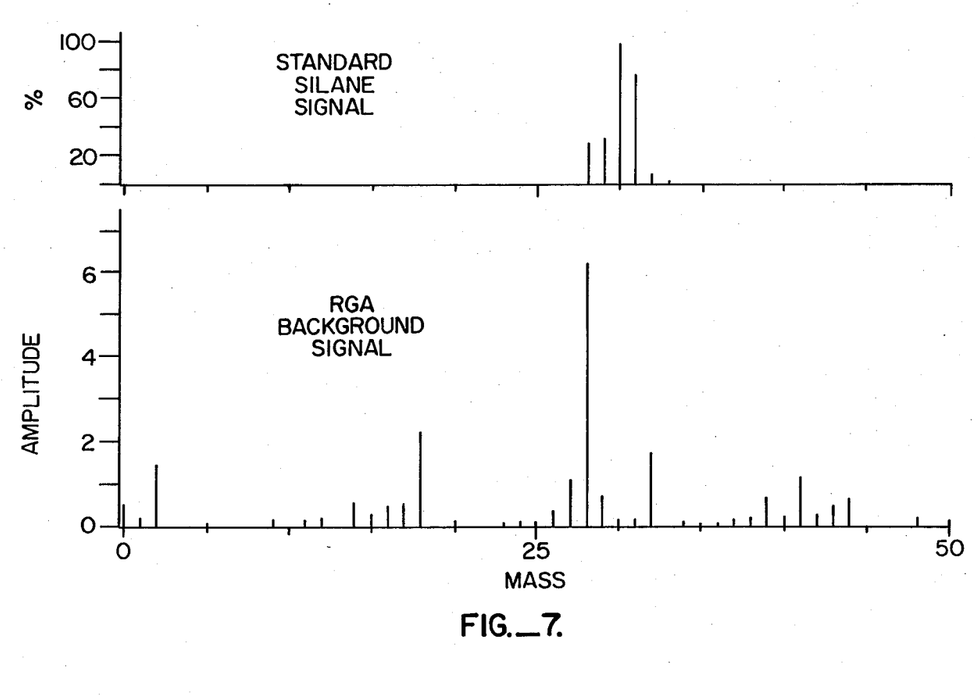
FIGS. 7–10 illustrate the experimental results of a prototype system demonstrating the efficacy of the method and apparatus of the present invention.

The output of the RGA was in the form of mass scans covering the range of interest from mass 1 to 50. FIG. 7 is a library mass scan of silane alone showing the principle peaks at Si (mass 28), SiH (mass 29), $SiH_2$ (mass 30), $SiH_3$ (mass 31), and $SiH_4$ (mass 32). The bottom curve shows the background scan at base pressure of $8 \times 10^{-7}$ Torr. The dissociative ionization fragment $SiH_3$ (mass 31) was used for all subsequent removal calculations since the background at mass 31 is negligible whereas any air in the background gas would give competing peaks for $N_2$ (mass 28) and for $O_2$ (mass 32). There was a minor background intensity in the spectrum for $H_2$ (mass 2) which was subtracted from the $H_2$ signals.

Figure 8:
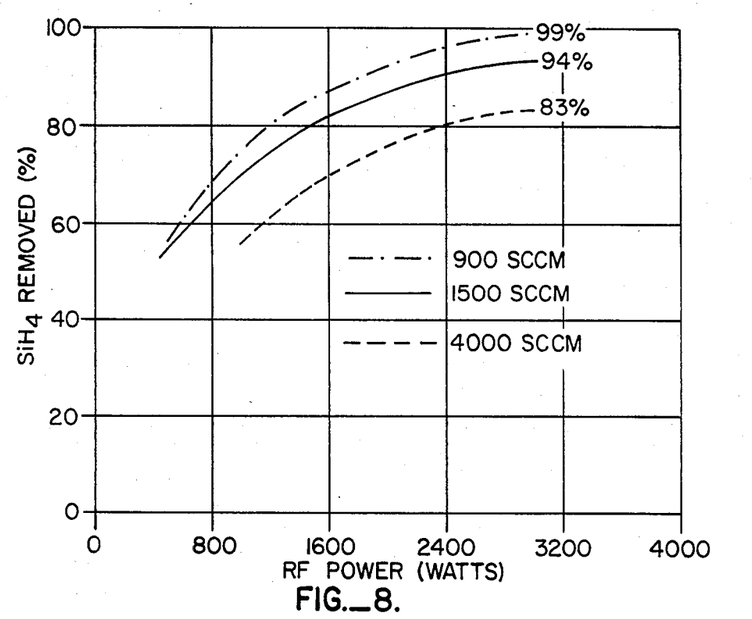

A record was made of the measurements including the experiment number, rf power level, $SiH_3$ relative signal, $H_2$ relative signal, silane flow in standard $cm^3$ per minute (sccm), RGA gain, RGA pressure, and TC gauge pressure in mTorr. From this record, graphs were prepared illustrating the performance of the PER. FIG. 8 shows the change in $SiH_3$ (proportional to silane) for rf power-off and power-on divided by the signal with power-off. This represents the amount of silane removed by the PER as a function of rf power. It was found that the gas load changed the relative efficiency. At 3000 watts, at least 99% of the silane was removed from a 900 sccm flow; about 94% was removed for a 1500 sccm flow; and about 83% was removed for a 4000 sccm flow.

Figure 9:
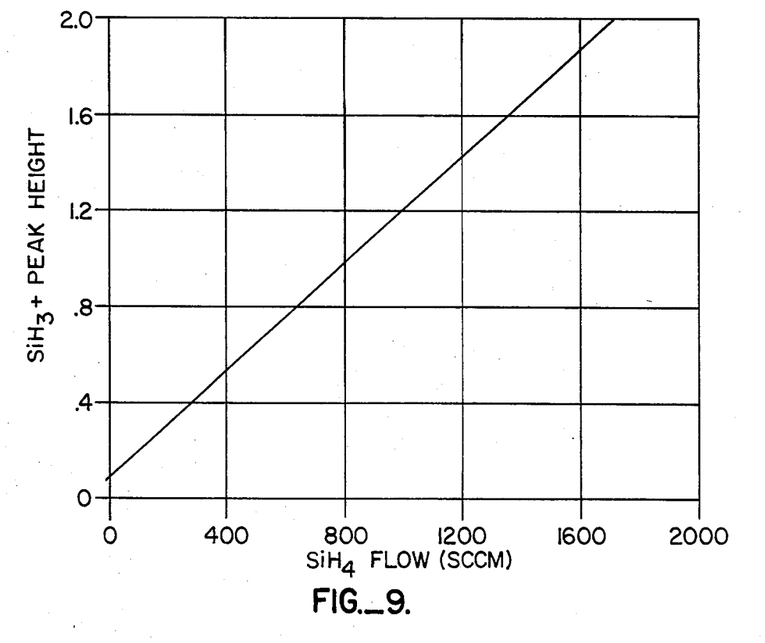
Figure 10:
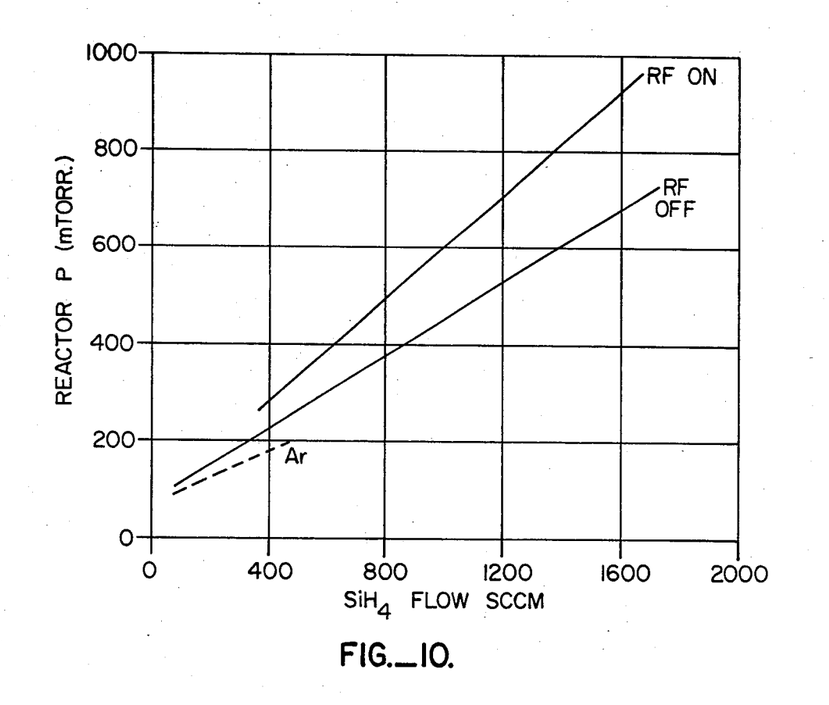

FIG. 9 is a graph of the relative $SiH_3$ peak height for silane as a function of silane mass flow. There is a linear response, indicating that the deposition of silane does not fall off with increasing load. A linear response of reactor pressure with flow is also obtained, as shown in FIG. 10. The increase in pressure with rf power on confirms the partial dissociation of $SiH_4$ is consistent with the $H_2$ signal analysis above.

The deposited film on the electrodes was analyzed and confirmed to be amorphous silicon. The film was adherent and easily disposed of together with the electrode substrate.

Although the foregoing invention has been described in some detail by way of illustration and example for purposes of clarity of understanding, it will be obvious that certain changes and modifications may be practiced within the scope of the appended claims.

What is claimed is:

1. A method for extracting a vapor from an exhaust gas stream, said method comprising:
   passing the exhaust gas stream between opposed, parallel electrodes; and
   driving the electrodes under conditions selected to electronically excite the vapor and to cause substantially all of the excited vapor to react at the surface of the electrodes to deposit a stable film thereon whereby in excess of above 75 mole % of the vapor is extracted from the exhaust gas stream.

2. A method as in claim 1, wherein the electrodes are replaced after the film thickness exceeds a predetermined amount.

3. A method as in claim 1, wherein the electrodes define a convoluted flow path for the exhaust stream.

4. A method as in claim 3, wherein the electrodes define a spiral flow path.

5. A method as in claim 3, wherein the electrodes comprise a first bank of parallel electrodes interleaved with a second bank of parallel electrodes to define a reversing serpentine path from the inlet to the outlet.

6. A plasma extraction reactor comprising:
   a vessel chamber defining an inlet port and an outlet port;
   spaced-apart, parallel electrodes located within the vessel and defining a convoluted flow path between said inlet and outlet ports; and
   means for driving the electrodes under conditions capable of electronically exciting a vapor species in an exhaust stream passing between the electrodes.

7. A plasma extraction reactor as in claim 6, wherein the electrodes comprise a pair of spaced-apart, parallel electrodes which define a spiral flow path from the inlet to the outlet.

8. A plasma extraction reactor as in claim 6, wherein the electrodes comprise a first bank of parallel electrodes interleaved with a second bank of parallel electrodes to define a reversing serpentine path from the inlet to the outlet.

9. A method for extracting vapor species from an exhaust stream, said method comprising:
   passing the exhaust stream through a volume defined by opposed, parallel electrodes, wherein the ratio of the surface area of the electrodes to the volume therebetween is in excess of about 1 $cm^{-1}$; and
   driving the electrodes under conditions selected to react at least about 75 mole % of the vapor species on the surface of the electrodes.

10. A method as in claim 9, wherein the electrodes are replaced after a predetermined amount of the species have deposited on them.

11. A method as in claim 9, wherein the electrodes define a convoluted flow path for the exhaust stream.

12. A method as in claim 11, wherein the electrodes define a spiral flow path.

13. A method as in claim 11, wherein the electrodes comprise a first bank of parallel electrodes interleaved with a second bank of parallel electrodes to define a reversing serpentine path from the inlet to the outlet.

14. A plasma extraction reactor comprising:
   a vessel chamber defining an inlet port and an outlet port;
   spaced-apart, parallel electrodes located within the vessel and defining a flow path between said inlet and outlet ports, wherein the ratio of the surface area to the volume is at least about 1 $cm^{-1}$; and
   means for driving the electrodes under conditions capable of electronically exciting a vapor species in an exhaust stream passing between the electrodes.

15. A plasma extraction reactor as in claim 14, wherein the electrodes comprise a pair of spaced-apart, parallel electrodes which define a spiral flow path from the inlet to the outlet.

16. A plasma extraction reactor as in claim 14, wherein the electrodes comprise a first bank of parallel electrodes interleaved with a second bank of parallel electrodes to define a reversing serpentine path from the inlet to the outlet.

17. A plasma extraction reactor as in claim 14, wherein the length of the flow path between the electrodes is at least about 100 cm.

18. A method for extracting vapor species from an exhaust stream, said method comprising:
   passing the exhaust stream from an inlet to an outlet on a flow path defined by opposed, parallel electrodes, wherein said electrodes are arranged to intensify an electric field therebetween proximate the outlet end of the flow path; and driving the electrodes under conditions selected to deposit at least about 80 mole % of the species on the surface of the electrodes.

19. A method as in claim 18, wherein the electrodes are replaced after a predetermined amount of the species have deposited on them.

20. A method as in claim 18, wherein the electrodes define a convoluted flow path for the exhaust stream.

21. A method as in claim 20, wherein the electrodes define a spiral flow path.

22. A method as in claim 20, wherein the electrodes comprise a first bank of parallel electrodes interleaved with a second bank of parallel electrodes to define a reversing serpentine path from the inlet to the outlet.

23. A method as in claim 18, wherein the ratio of the electrode area to the volumetric flow rate of the exhaust stream is at least about 10 min/cm.

24. A plasma extraction reactor comprising:
- a vessel chamber defining an inlet port and an outlet port;
- spaced-apart, parallel electrodes located within the vessel and defining a flow path between said inlet and outlet ports, wherein said electrodes are arranged to intensify an electric field therebetween proximate the outlet end of the flow path; and
- means for driving the electrodes under conditions capable of electronically exciting a vapor species passing therebetween.

25. A plasma extraction reactor as in claim 24, wherein the electrodes comprise a pair of spaced-apart, parallel electrodes which define a spiral flow path from the inlet to the outlet.

26. A plasma extraction reactor as in claim 24, wherein the electrodes comprise a first bank of parallel electrodes interleaved with a second bank of parallel electrodes to define a reversing serpentine path from the inlet to the outlet.

* * * * *